US008679355B2

(12) United States Patent
Pohlmann et al.

(10) Patent No.: US 8,679,355 B2
(45) Date of Patent: Mar. 25, 2014

(54) MEMS ELEMENT

(75) Inventors: Hauke Pohlmann, Hamburg (DE);
Ronald Dekker, Valkenswaard (NL);
Joerg Mueller, Hamburg (DE); Martin Duemling, Hamburg (DE)

(73) Assignee: NXP, B.V., Eindhoven (NL)

( * ) Notice: Subject to any disclaimer, the term of this patent is extended or adjusted under 35 U.S.C. 154(b) by 52 days.

(21) Appl. No.: 13/321,116

(22) PCT Filed: May 26, 2010

(86) PCT No.: PCT/IB2010/052348
§ 371 (c)(1),
(2), (4) Date: Jan. 27, 2012

(87) PCT Pub. No.: WO2010/136986
PCT Pub. Date: Dec. 2, 2010

(65) Prior Publication Data
US 2012/0122314 A1    May 17, 2012

(30) Foreign Application Priority Data

May 27, 2009  (EP) .................................... 09161293

(51) Int. Cl.
*C23F 1/00*  (2006.01)
(52) U.S. Cl.
USPC ............... 216/2; 216/44; 216/52; 438/689; 438/690; 438/691; 29/594; 29/847; 29/831
(58) Field of Classification Search
USPC ............... 216/2, 44; 438/689–692, 700, 703; 29/594, 831, 847
See application file for complete search history.

(56) References Cited

U.S. PATENT DOCUMENTS

| 6,767,749 B2 * | 7/2004 | Kub et al. ................. 438/3 |
| 7,406,761 B2 * | 8/2008 | Jafri et al. ................ 29/831 |
| 2003/0054645 A1 | 3/2003 | Sheldon |

(Continued)

FOREIGN PATENT DOCUMENTS

| EP | 1 529 753 A2 | 5/2005 |
| EP | 1 764 917 A1 | 3/2007 |
| WO | 2007/057814 A2 | 5/2007 |
| WO | 2007/078989 A2 | 7/2007 |

OTHER PUBLICATIONS

Zalalutinov, M. et al.;"Optically Pumped Parametric Amplification for Micromechanical Oscillators"; Applied Physics Letters, vol. 78, No. 20; 3 pages (May 14, 2001).

(Continued)

*Primary Examiner* — Nadine Norton
*Assistant Examiner* — Maki Angadi

(57) ABSTRACT

A method of manufacturing an electronic device that comprises a microelectromechanical (MEMS) element, the method comprising the steps of: providing a material layer (34) on a first side of a substrate (32); providing a trench (40) in the material later (34); etching material from the trench (40) such as to also etch the substrate (32) from the first side of the substrate (32); grinding the substrate (32) from a second side of the substrate to expose the trench (40); and using the exposed trench (40) as an etch hole. The exposed trench (40) is used as an etch hole for releasing a portion of the material layer (34), for example a beam resonator (12), from the substrate (32). An input electrode (6), an output electrode (8), and a top electrode (10) are provided.

13 Claims, 6 Drawing Sheets

(56) References Cited

U.S. PATENT DOCUMENTS

2005/0218488 A1* 10/2005 Matsuo .................. 257/678
2006/0081056 A1   4/2006 Silverbrook et al.
2008/0290494 A1  11/2008 Lutz et al.

OTHER PUBLICATIONS

Wang, J. et al.; "1.51-GHz Nanocrystalline Diamond Micromechanical Disk Resonator With Material-Mismatched Isolating Support"; Proc. 17th Int'l. IEEE Micro Electro Mechanical Systems Conf., Maastrich, NL, pp. 641-644, (Jan. 2004).

Dekker, R. "Substrate Transfer Technology" PhD. Thesis, Delft University of Technology, 216 pgs. (2004).

Partridge, A. et al.; "MEMS Resonators Look to Displace Quartz Resonators", MEMS Manufacturing, retrieved from the Internet at www.mems-manufacturing.com, Applied Physics, pp. 11-14 (2006).

International Search Report & Written Opinion for Int'l Patent Application No. PCT/IB2010/052348 (Dec. 16, 2010)xxx.

* cited by examiner

MEMS ELEMENT

BACKGROUND

Brief Background Introduction

The present invention relates to MEMS devices. The present invention is particularly suited to, but not limited to the fabrication of MEMS devices.

DETAILED DESCRIPTION

Figure 1:
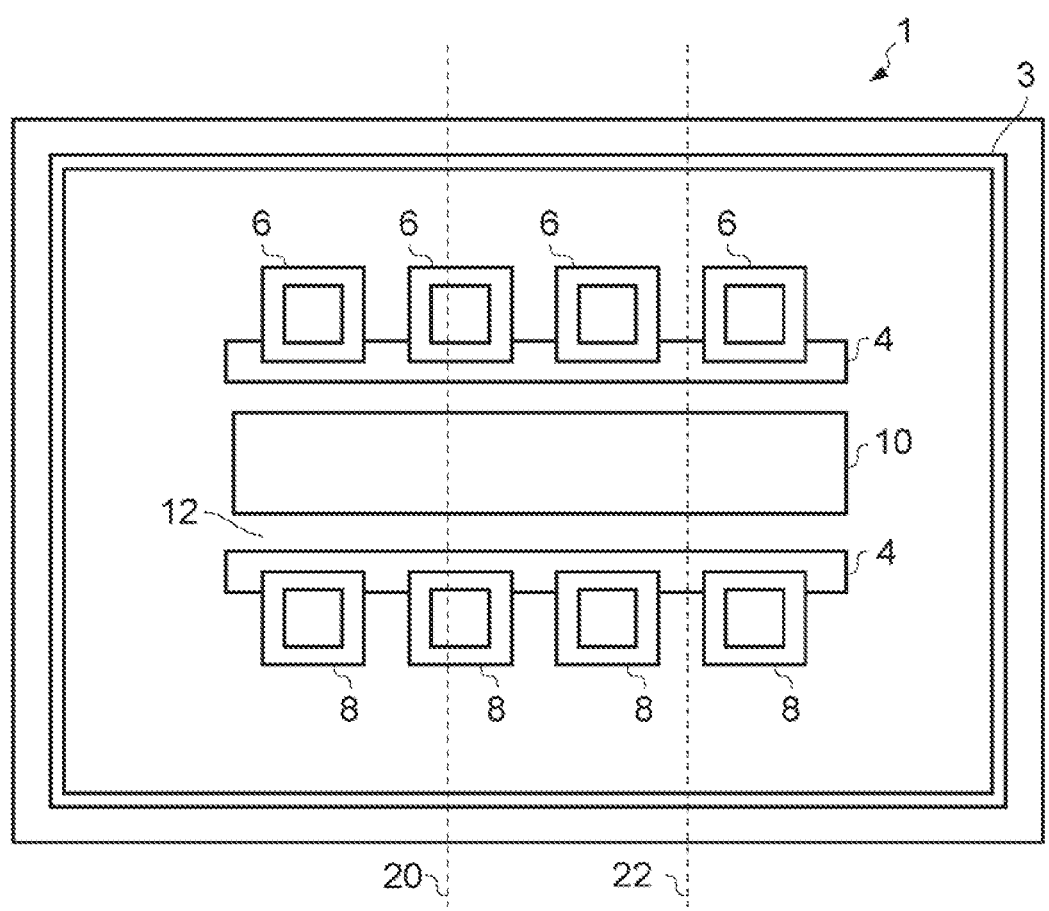
FIG. 1 is a schematic illustration (not to scale) of a top view of a MEMS RF resonator which has been fabricated according to a first embodiment of the present invention.

WO 2007/057814 describes a method by which a polysilicon MEMS-device is fabricated. The resonator of the device is embedded in between two sacrificial oxide layers and subsequently protected by a silicon nitride etch stop layer. The wafer is then temporarily glued top-down to a carrier wafer and thinned down from the backside to 20-30 µm remaining silicon. From the backside trenches are etched into the wafer using photolithography and anistropic silicon etching. After releasing the resonator with a wet etch process the trenches are closed with a PECVD process. Due to the poor step coverage of the PECVD process the trenches are sealed without much material deposited on the bottom of the trench. The pressure in the PECVD process chamber during deposition defines the pressure in the resonator cavity. The resonator is then removed from the temporary carrier and can be diced and packaged in any standard plastic package.

However, this process is limited to the packaging and fabrication of polysilicon resonators.

An improvement to the method of fabricating a MEMS device described in WO 2007/057814 is known. In an improved method, the resonator is realized in single crystalline silicon using a SOI-wafer with an active silicon layer. The resonator is defined via trench etching in the top silicon layer after the field oxidation. The gap between the electrode and the resonator is defined by a spacer technology. The trench is then filled with polysilicon. The polysilicon filled trenches are used as input and output electrodes. To obtain access to the upper sacrificial layer (LOCOS) during the final release etch, the polysilicon is removed from some trenches. These front side etch channels are filled with LPCVD-TEOS. After the deposition of a nitride etch stop layer a CMOS-compatible two layer metallization follows. After the metallization the same processing is done as described in WO 2007/057814, i.e. the silicon wafer is clued to a class substrate and grinded back. From the backside, deep trenches are etched into the silicon down to the buried oxide layer. These trenches serve as etch holes for releasing the structure with a wet etch process.

However, achieving overlay accuracy better than 0.5 µm over the whole wafer between the front- and backside photolithography is very challenging due to wafer warping of the thinned wafer and due to edge damage resulting from grinding.

The present inventors have realised it would be desirable to avoid the backside photolithography process or processes of the current methods.

The present inventors have further realised it would be desirable to avoid the backside etch process or processes of the current methods. In a first aspect, the present invention provides a method of manufacturing an electronic device that comprises a microelectromechanical (MEMS) element, the method comprising the steps of:

providing a material layer on a first side of a substrate;
providing a trench in the material later;
etching material from the trench such as to also etch the substrate from the first side of the substrate:
grinding the substrate from a second side of the substrate to expose the trench; and
using the exposed trench as an etch hole for releasing a portion of the material layer from the substrate.

The method of manufacturing an electronic device may further comprise sealing the exposed trench.

Sealing the exposed trench may provide a vacuum cavity around the released portion of the material layer.

The released portion of the material layer may be a beam resonator.

The beam resonator may be a single crystalline resonator.

The method of manufacturing an electronic device may further comprise providing an input electrode, an output electrode, and a top electrode.

The electronic device may be manufactured using a CMOS or a BIMOS process.

The method can be for manufacturing an electronic device that comprises a microelectromechanical (MEMS) element, which is provided with an input electrode, an output electrode, a top electrode, and a beam resonator, wherein the beam resonator is defined in a cavity, and the cavity provides a gap between the beam resonator and each of the input electrode, the output electrode, and the top electrode. The method can comprise the steps of:

providing the substrate with a first side and a second side, the second side opposite the first side;
providing a lower sacrificial layer on the first side of the substrate;
providing the material layer in the form of an active layer on the lower sacrificial layer;
providing an upper sacrificial layer on the active layer;
providing a top electrode on a portion of the upper sacrificial layer;
etching trenches for the input electrode and the output electrode through the upper sacrificial layer and the active layer such that a portion of the active layer is defined as the resonator, wherein the resonator is separated from the input and output electrodes by spacer material;

filling the etched trenches;

removing the material filling some of the filled etched trenches;

further etching said some of the trenches to perform said etching of the substrate from the first side of the substrate such as to define extended tranches;

filling the extended trenches with a sacrificial material; and performing said grinding to remove a portion of the substrate from the second side such that the extended trenches are accessible, wherein using the exposed trench as an etch hole comprises removing the material filling the extended trenches;

removing the spacer material in contact with the resonator;

removing the lower sacrificial layer in contact with the resonator; and removing the upper sacrificial layer in contact with the resonator.

The method may further comprise providing a sealant layer on the second side of the substrate such that a sealed vacuum cavity is formed around the resonator.

The method may further comprise providing a device layer on the top electrode and on a portion of the upper sacrificial layer; providing a glue layer on the device layer; and providing a glass wafer on the glue layer.

Embodiments of the present invention will now be described, by way of example, with reference to the accompanying drawings, in which:

FIG. 1 is a schematic illustration (not to scale) of a top view of a MEMS RF resonator 1 which has been fabricated according to a first embodiment of the present invention. The MEMS RF resonator 1 comprises a seal ring 3, a cavity 4, an input electrode 6, an output electrode 8 and a top electrode 10.

The cavity 4 defines a beam resonator 12 and provides a narrow gap between the beam resonator and the electrodes 6, 8.

A first embodiment of a method of fabricating the MEMS RF resonator 1 of FIG. 1 will now be described with reference to FIGS. 2 to 9.

Figure 2:
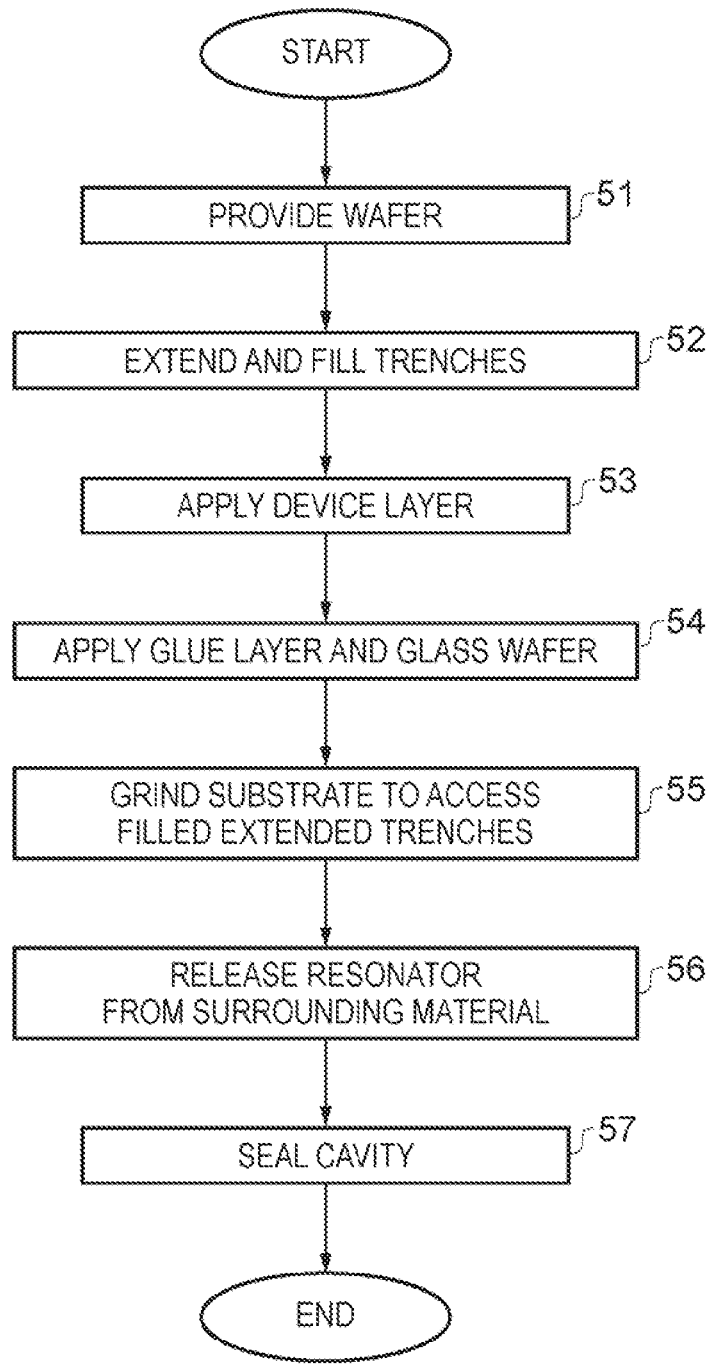
FIG. 2 is a process flow chart showing certain process steps carried out in one embodiment of a fabrication process for fabricating a MEMS RF resonator.

FIG. 2 is a process flow chart showing certain process steps carried out in one embodiment of a fabrication process for fabricating the above described MEMS RF resonator 1. FIGS. 3-9 are schematic cross-sections of the MEMS RF resonator 1 at various stages of the process of FIG. 2, shown at either a first cross section 20 or a second cross section 22. The same reference numerals as those employed in FIG. 1 have been used to indicate the same elements.

Figure 3A:
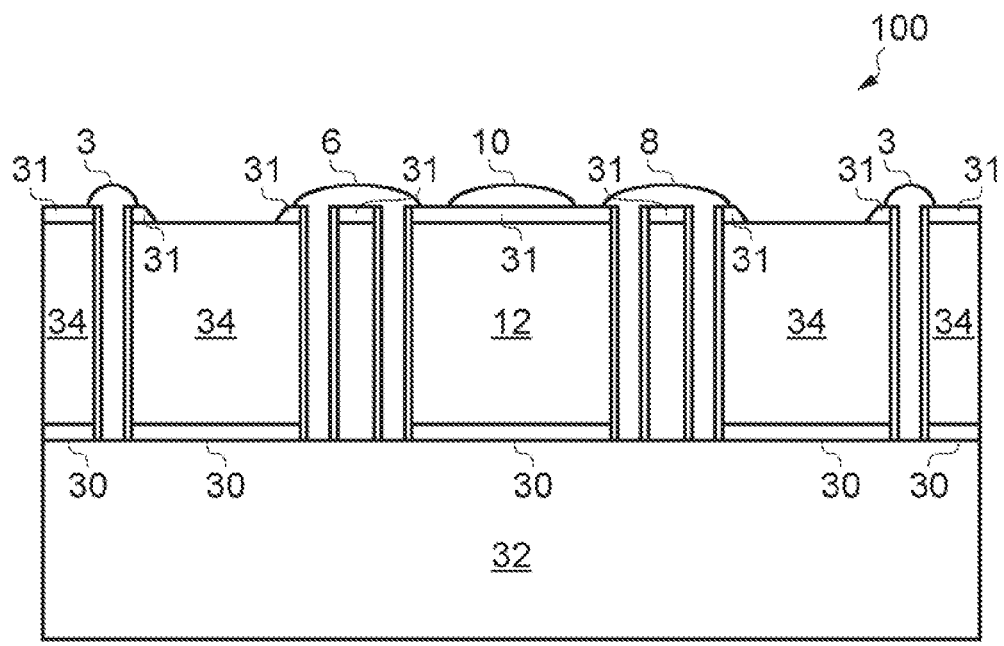
FIG. 3A is a schematic illustration (not to scale) of first cross sectional view of a SOI wafer at step s1 of the fabrication process of FIG. 2.
Figure 3B:
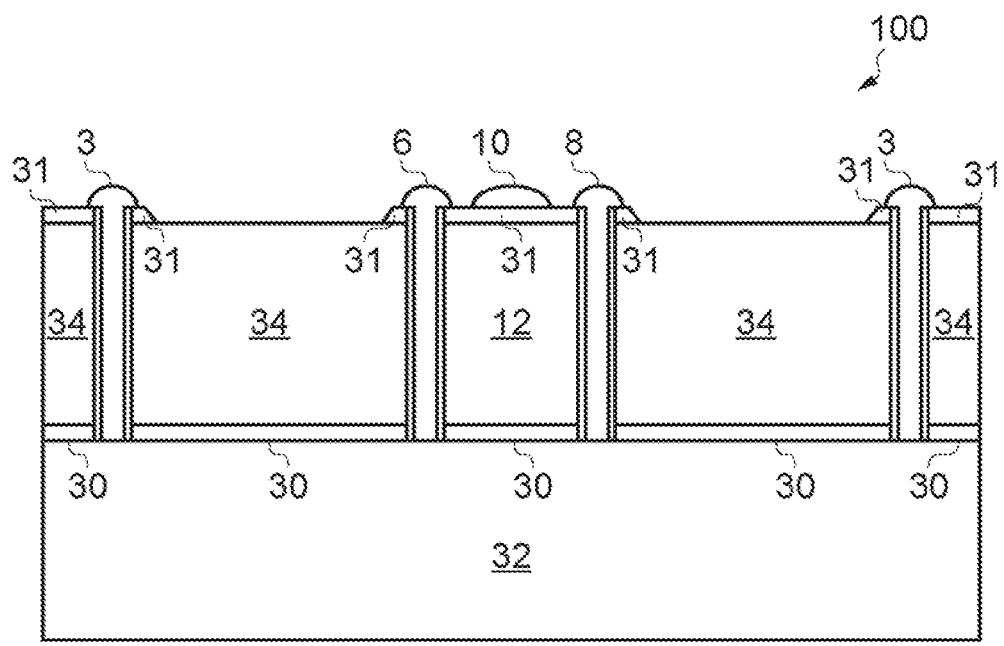
FIG. 3B is a schematic illustration (not to scale) of second cross sectional view of a SOI wafer at step s1 of the fabrication process of FIG. 2.

At step s1, an SOI wafer 100 is provided. FIG. 3A is a schematic illustration (not to scale) of a cross sectional view of the SOI wafer 100, corresponding to the first cross position 20 shown in FIG. 1. FIG. 3B is a schematic illustration (not to scale) of a cross sectional view of the SOI wafer 100, corresponding to the second cross position 22 shown in FIG. 1.

The SOI wafer comprises a silicon substrate 32, a lower sacrificial oxide layer 30, an active silicon layer 34 and an upper sacrificial oxide layer 31. The active silicon layer 34 is 10 μm thick. The lower sacrificial oxide layer 30 is deposited on the silicon substrate 32. The active silicon layer 34 is deposited on the lower sacrificial oxide layer 30. The upper sacrificial oxide layer 31 is deposited on the lower sacrificial oxide layer 30.

The resonator 12 is formed from the active silicon layer 34.

The resonator 12 is defined in the active silicon layer 34 via trench etching. Trenches are etched for the input electrode 6 and the output electrode 8. These trenches are then filled with polysilicon to form the input and output electrodes 6, 8. The resonator 12 is separated from the electrodes 6, 8 using a spacer technology. The resonator 12 is separated from the electrodes 6, 8 by a TEOS-spacer process. The gap between the resonator 12 and the electrodes 6, 8 defined by spacer technology is smaller than 100 nm. The resonator 12 is separated from the silicon substrate 32 by the lower sacrificial oxide layer 30. The resonator 12 is separated from the top electrode 10 by the upper sacrificial oxide layer 31. The sacrificial oxide layers 30, 31 are formed from a LOCOS oxide.

At step s2, the polysilicon is removed from some parts of the polysilicon filled etched trenches. The trenches are further etched in to the silicon substrate 32. The trenches are then filled. The trenches link the upper sacrificial oxide layer 31 and the lower sacrificial oxide layer 30.

Figure 4:
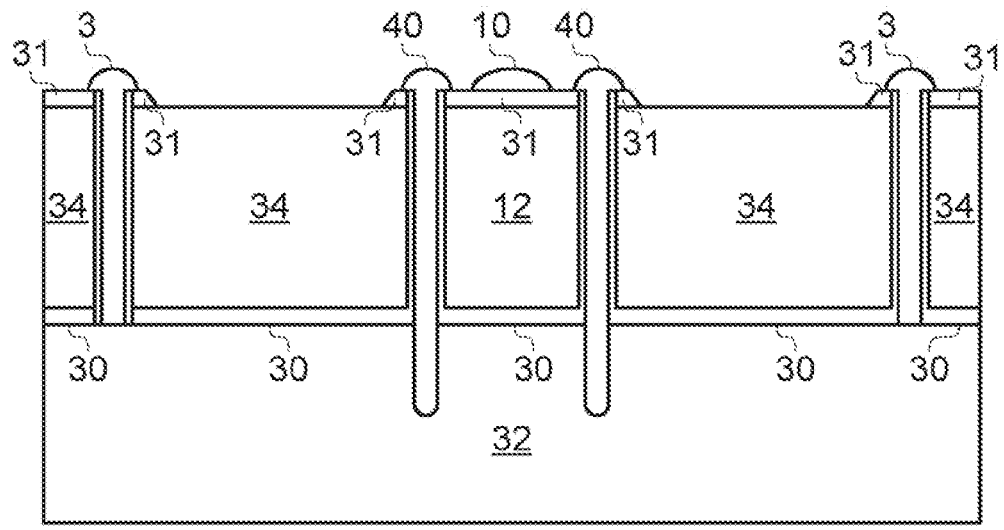
FIG. 4 is a schematic illustration (not to scale) of second cross sectional view of a SOI wafer at step s2 of the fabrication process of FIG. 2.

FIG. 4 is a schematic illustration (not to scale) showing the second cross section 22 of the SOI wafer 100 at step s2 of the fabrication process. FIG. 4 shows the SOI wafer 100 of FIG. 3B at step s2 of the fabrication process. The polysilicon in the etched trenches in this portion of the SOI wafer 100 is removed from the trenches. The trenches are etched further. The trenches are etched so that they extend into the silicon substrate 32. The trenches are etched so that they extend 30 μm into the silicon substrate 32. The extended trenches are then filled with LPCVD-TEOS to form filled trenches 40.

At step s2, polysilicon is not removed from the all electrode trenches. Parts of the SOI wafer with a cross section the same as the first cross section 20 do not have the polysilicon removed. Thus in these parts of the SOI wafer, the input electrodes 6 and the output electrodes 8 remain intact, and only at parts of the SOI wafer 100 with a cross section the same as the second cross section 22 are the extended, LPCVD-TEOS filled trenches 40 formed.

Figure 5:
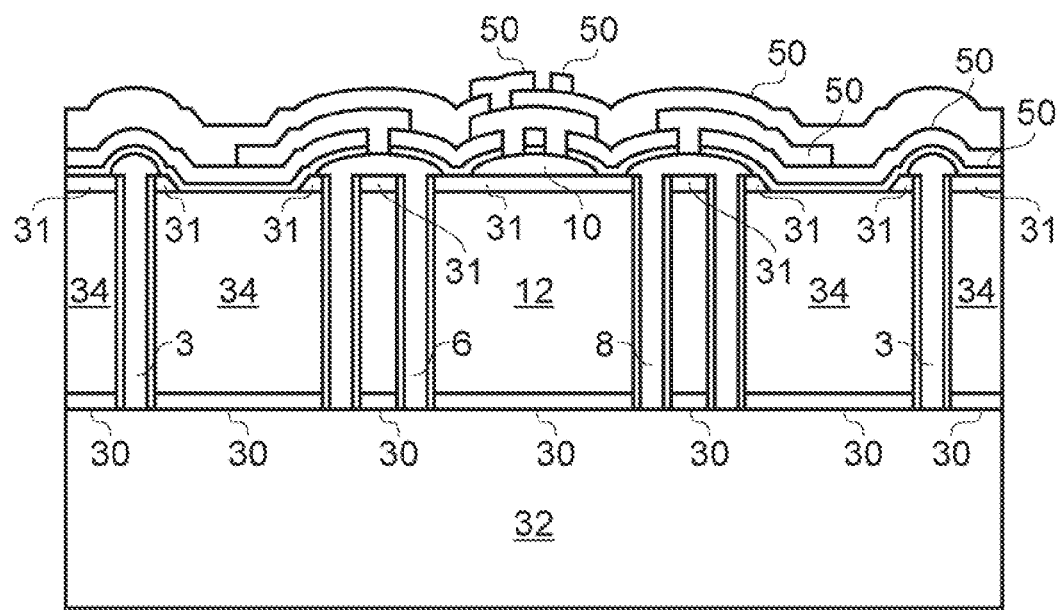
FIG. 5 is a schematic illustration (not to scale) of first cross sectional view of a SOI wafer at step s3 of the fabrication process of FIG. 2.

At step s3, a device layer 50 is applied to the SOI wafer 100. FIG. 5 is a schematic illustration (not to scale) showing the first cross section 20 of the SOI wafer 100 at step s3 of the fabrication process.

The device layer 50 is deposited on the active silicon layer 34, the input electrode 6, the output electrode 8, the top electrode 10, the filled trenches 40, the seal ring 3 and the upper sacrificial layer 30. In this example, the device layer 50 comprises a plurality of component layers. Each of the component layers of the device layer 50 is shown in FIG. 5 and is marked with the reference numeral, 50, of the device layer. In the Figures following FIG. 5 (FIG. 6 to FIG. 9) the device layer 50 will be shown as a single layer marked with the reference numeral 50. The device layer 50 comprises a LPCVD nitride etch stop layer deposited over the whole SOI wafer 100. A standard CMOS two layer metallisation process is then used to electrically connect the resonator 12 and the electrodes 6, 8.

The device layer 50 is deposited over the whole of the SOI wafer, including at parts of the wafer that correspond with the second cross section 22.

Figure 6:
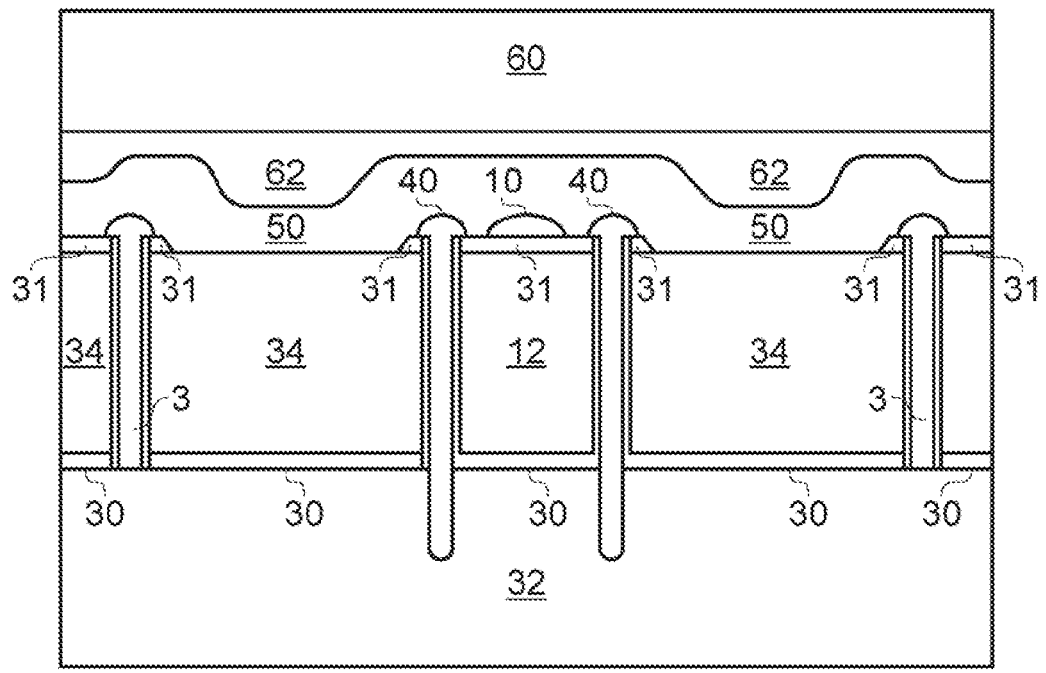
FIG. 6 is a schematic illustration (not to scale) of second cross sectional view of a SOI wafer at step s4 of the fabrication process of FIG. 2.

At step s4 a glue layer 62 is deposited on the device layer 50. A glass wafer 60 is then deposited on the glue layer 62. FIG. 6 is a schematic illustration (not to scale) showing the second cross section 22 of the SOI wafer 100 at step s4 of the fabrication process.

Figure 7:
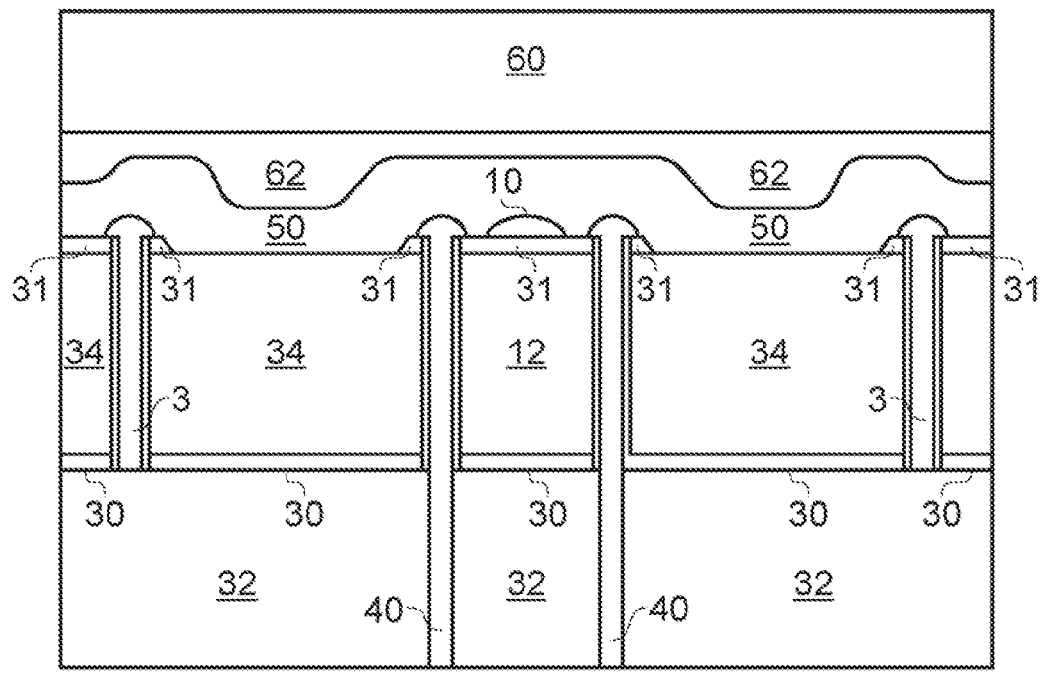
FIG. 7 is a schematic illustration (not to scale) of second cross sectional view of a SOI wafer at step s5 of the fabrication process of FIG. 2.

At step s5, a portion of the silicon substrate 32 of the SOI wafer 100 is removed such that the filled trenches 40 are accessible. The silicon substrate is ground away until the silicon substrate is 20 μm thick. FIG. 7 is a schematic illustration (not to scale) showing the second cross section 22 of the SOI wafer 100 at step s5 of the fabrication process.

Figure 8:
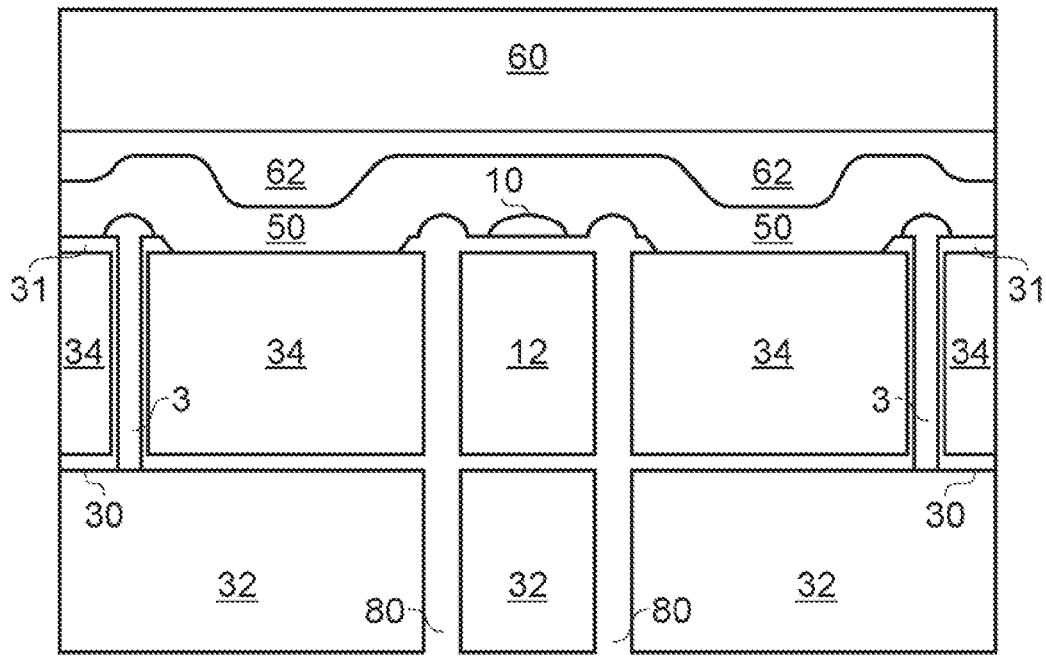
FIG. 8 is a schematic illustration (not to scale) of second cross sectional view of a SOI wafer at step s6 of the fabrication process of FIG. 2.

At step s6, the material filling the filled trenches 40, the sacrificial oxide layers 30, 31 and the spacer material are removed. The removal of the material filling the filled trenches 40, the sacrificial oxide layers 30, 31 and the spacer material forms a cavity 80 around the resonator 12. Thus, the resonator 12 is released from contact with the surrounding material. The material filling the filled trenches 40 and the sacrificial oxide layer 30 are removed using hydrofluoric acid applied to the filled trenches 40 where the silicon substrate 32 was removed using a wet etch process. FIG. 8 is a schematic illustration (not to scale) showing the second cross section 22 of the SOI wafer 100 at step s6 of the fabrication process.

Figure 9:
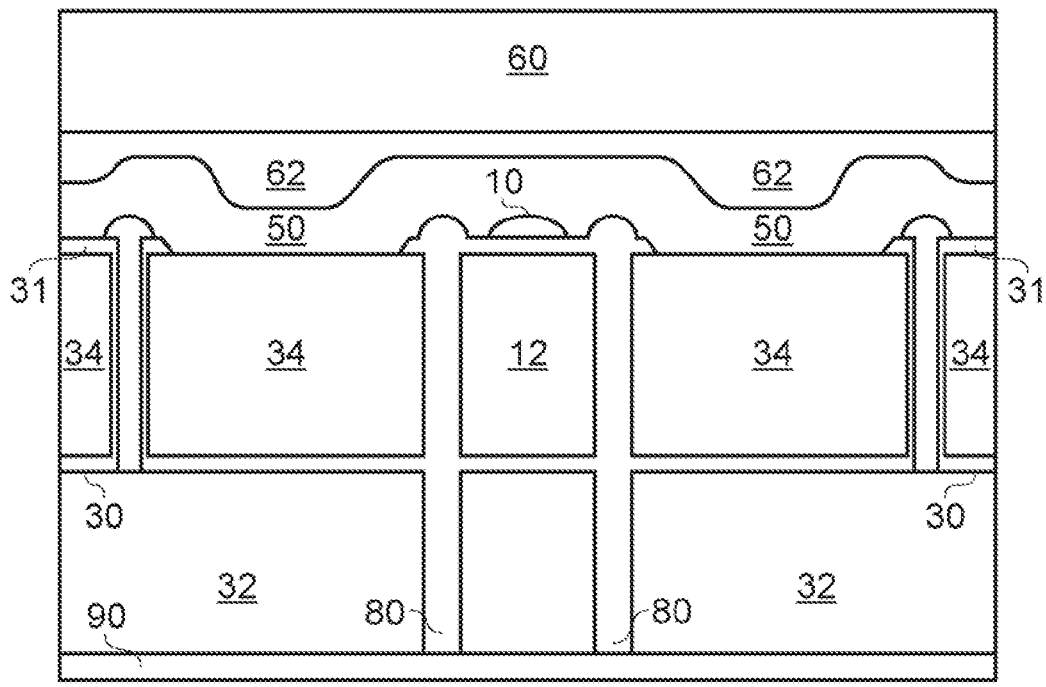
FIG. 9 is a schematic illustration (not to scale) of second cross sectional view of a SOI wafer at step s7 of the fabrication process of FIG. 2.

At step s7, the cavity 80 is sealed. The cavity 80 is sealed such that the cavity 80 is a vacuum cavity. The cavity 80 is sealed using a sealant layer 90. The sealant layer 90 is made using a combination of PECVD-oxide and metal deposition processes. FIG. 9 is a schematic illustration (not to scale) showing the second cross section 22 of the SOI wafer 100 at step s7 of the fabrication process.

Thus, in this embodiment, a MEMS RF resonator 1 with a resonator 12 is provided. The glass wafer 60 can be removed from the SOI wafer 100 which can be diced and packaged in a standard plastic package.

The above described process tends to advantageously avoid a lithography process and/or an RIE etching process from the backside. Thus, the above described process tends to be significantly simpler and/or more cost-effective than the state of the art.

A further advantage of the above described MEMS device and process is that it tends to allow the integration of high quality coils into the device without additional process steps. This is achieved by using the trench etching for the electrode definition and the polysilicon removal step to divide the silicon underneath the coil into cuboids. This way no current flow underneath the coils is possible and a similar Q-factor is obtained as by removing the substrate.

A further advantage of the above described MEMS device and process is that it tends to allow for the packaging of a single crystalline resonator. The advantages of a single crystalline resonator are that it tends to have improved mechanical properties, less intrinsic losses and/or better hysteresis. An additional advantage of the single crystalline silicon is that it tends to be possible to manufacture thicker resonators since the deposition rate of single crystalline silicon is significantly higher then that of polysilicon (up to 4000 nm/min compared to 10 nm/min). Also, the stress in a polysilicon layer tends to be significantly higher that that in single crystalline silicon. A thicker layer results in a heavier resonator that tends to be more frequency stable since it is less affected by process variations and contaminations. A thick silicon layer tends also to have the advantages of larger electrode areas, resulting in a larger signal.

A further advantage of the above described MEMS device and process is that it tends to allow for a third electrode to be integrated on top of the resonator. This additional electrode tends to allow for drive and pick up movements in all three dimension. This additional electrode tends to allow for the tuning of the frequency, and/or allows for the manufacture of an acceleration sensor that is sensible in all three directions.

A further advantage of the above described MEMS device and process is that it tends to provide a well-defined support and electrical contact in the centre of the structure. For example, a disk resonator can be suspended at its centre without the need to etch through the resonator and/or without the need to etch on time. These features tend to be required by the state of the art in order to obtain support.

Furthermore, the above described MEMS device and process tends to be advantageously easy to integrate in a CMOS or BIMOS process. This is because the releasing of the resonator is done after the wafer is glued to a temporary substrate, and because the MEMS device has a relatively low temperature budget. Moreover, the additional thermal budget and the buried oxide tend to negligibly influence the electrical parameters e.g. of the transistors of a NXP BIMOS 1.2D process.

In the above embodiment, at step s1, the active silicon layer 34 is 10 μm thick. However, in other embodiments the active silicon layer is a different thickness.

In the above embodiment, at step s1, the electrodes are formed from polysilicon. However, in other embodiments the electrodes are formed from a different material.

In the above embodiment, at step s1, the resonator 12 is separated from the electrodes 6, 8 by a TEOS-spacer process. However, in other embodiments an alternative process is used.

In the above embodiment, the sacrificial oxide layers are a LOCOS oxide. However, in other embodiments, one or more of the sacrificial oxide layers are a different appropriate material.

In the above embodiment, at step s1, the gap between the resonator 12 and the electrodes 6, 8 defined by spacer technology is smaller than 100 nm. However, in other embodiments the gap is a different size, for example, 100 nm or larger.

In the above embodiment, at step s2, trenches are etched so that they extend 30 μm into the silicon substrate 32. However, in other embodiments the trenches are etched so that they extend a different amount into the silicon substrate.

In the above embodiment, at step s2, the trenches are filled with LPCVD-TEOS. However, in other embodiments the trenches are filled with a different material.

In the above embodiment, at step s5, the silicon substrate is ground away. However, in other embodiments the silicon substrate is removed by an alternative method.

In the above embodiment, at step s5, the silicon substrate is ground away until the silicon substrate is 20 μm thick. However, in other embodiments the silicon substrate is ground away until the silicon substrate is a different appropriate thickness, for example, the silicon substrate is ground away until the LPCVD-TEOS filled trenches 40 become visible from the silicon substrate side of the SOI wafer 100.

In the above embodiment, at step s6, the material filling the filled trenches 40 and the sacrificial oxide layer 30 are removed using hydrofluoric acid. However, in other embodiments, a suitable method of removing the material is used.

In the above embodiment, at step s7, the cavity 80 is sealed such that the cavity 80 is a vacuum cavity. However, in other embodiments the cavity is sealed such that the cavity 80 is not a vacuum cavity. The pressure in the cavity around the resonator 12 is defined by the pressure in the process chamber during the process of sealing the cavity 80.

In the above embodiment, at step s7, the cavity 80 is sealed using a combination of PECVD-oxide and metal deposition processes. However, in other embodiments a different material is used as a sealant.

The invention claimed is:
1. A method of manufacturing an electronic device that comprises a microelectromechanical (MEMS) element, the method comprising the steps of:
providing a material layer on a first side of a substrate;
providing a trench in the material later;
etching material from the trench such as to also etch the substrate from the first side of the substrate;

grinding the substrate from a second side of the substrate to expose the trench; and using the exposed trench as an etch hole for releasing a portion of the material layer from the substrate.

2. A method of manufacturing an electronic device according to claim 1, further comprising sealing the exposed trench.

3. A method of manufacturing an electronic device according to claim 2, wherein sealing the exposed trench provides a vacuum cavity around the released portion of the material layer.

4. A method of manufacturing an electronic device according to claim 1, wherein the released portion of the material layer is a beam resonator.

5. A method of manufacturing an electronic device according to claim 4, wherein the beam resonator is a single crystalline resonator.

6. A method of manufacturing an electronic device according to claim 1, further comprising providing an input electrode, an output electrode, and a top electrode.

7. A method of manufacturing an electronic device according to claim 1, wherein the electronic device is manufactured using a CMOS or a BIMOS process.

8. A method as claimed in claim 1 of manufacturing an electronic device that comprises a microelectromechanical (MEMS) element, which is provided with an input electrode, an output electrode, a top electrode, and a beam resonator, the beam resonator is defined in a cavity, the cavity provides a gap between the beam resonator and each of the input electrode, the output electrode, and the top electrode, the method comprising the steps of:

providing the substrate with a first side and a second side, the second side opposite the first side;

providing a lower sacrificial layer on the first side of the substrate;

providing the material layer in the form of an active layer on the lower sacrificial layer;

providing an upper sacrificial layer on the active layer;

providing a top electrode on a portion of the upper sacrificial layer;

etching trenches for the input electrode and the output electrode through the upper sacrificial layer and the active layer such that a portion of the active layer is defined as the resonator, wherein the resonator is separated from the input and output electrodes by spacer material;

filling the etched trenches;

removing the material filling some of the filled etched trenches;

further etching said some of the trenches to perform said etching of the substrate from the first side of the substrate such as to define extended tranches;

filling the extended trenches with a sacrificial material; and performing said grinding to remove a portion of the substrate from the second side such that the extended trenches are accessible, wherein using the exposed trench as an etch hole comprises removing the material filling the extended trenches;

removing the spacer material in contact with the resonator;

removing the lower sacrificial layer in contact with the resonator; and removing the upper sacrificial layer in contact with the resonator.

9. A method of manufacturing an electronic device according to claim 8, further comprising:

providing a sealant layer on the second side of the substrate such that a sealed vacuum cavity is formed around the resonator.

10. A method of manufacturing an electronic device according to claim 8, further comprising:

providing a device layer on the top electrode and on a portion of the upper sacrificial layer;

providing a glue layer on the a device layer; and providing a glass wafer on the glue layer.

11. The method of claim 1, further comprising:

the portion comprising a part of the MEMS element.

12. The method of claim 1, wherein providing a trench in the material layer, further comprises:

providing at least two trenches in the material layer as etch holes for releasing the portion from the substrate.

13. The method of claim 1, wherein using the exposed trench as an etch hole, further comprises:

removing material filling trenches to provide a cavity around the released portion of the material layer.

* * * * *